(12) United States Patent
Liang et al.

(10) Patent No.: US 11,404,613 B2
(45) Date of Patent: Aug. 2, 2022

(54) LIGHT EMITTING DIODE PACKAGE STRUCTURE AND MANUFACTURING METHOD THEREOF AND DISPLAY DEVICE

(71) Applicant: Wistron Corporation, New Taipei (TW)

(72) Inventors: Zhiyi Liang, New Taipei (TW); Chih-Chou Chou, New Taipei (TW); Wei-Chia Huang, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 17/024,716

(22) Filed: Sep. 18, 2020

(65) Prior Publication Data

US 2022/0005983 A1 Jan. 6, 2022

(30) Foreign Application Priority Data

Jul. 6, 2020 (CN) .......................... 202010640296.9

(51) Int. Cl.
| | |
|---|---|
| *H01L 33/50* | (2010.01) |
| *H01L 23/00* | (2006.01) |
| *H01L 33/52* | (2010.01) |
| *H01L 25/13* | (2006.01) |
| *F21V 8/00* | (2006.01) |
| *H01L 33/62* | (2010.01) |

(52) U.S. Cl.
CPC .......... *H01L 33/504* (2013.01); *G02B 6/0073* (2013.01); *H01L 24/48* (2013.01); *H01L 25/13* (2013.01); *H01L 33/507* (2013.01); *H01L 33/52* (2013.01); *H01L 33/62* (2013.01); *H01L 2224/48105* (2013.01); *H01L 2224/48247* (2013.01); *H01L 2933/0041* (2013.01); *H01L 2933/0091* (2013.01)

(58) Field of Classification Search
CPC ....... H01L 33/504; H01L 24/48; H01L 25/13; H01L 33/507; H01L 33/52; H01L 33/62; H01L 2224/48105; H01L 2224/48247; H01L 2933/0041; H01L 2933/0091; G02B 6/0073
See application file for complete search history.

(56) References Cited

U.S. PATENT DOCUMENTS

| | | | | |
|---|---|---|---|---|
| 8,378,568 | B2 | 2/2013 | Sohn | |
| 2003/0137863 | A1* | 7/2003 | Takemura | G11C 5/14 365/63 |
| 2009/0262516 | A1* | 10/2009 | Li | H01L 33/56 362/84 |
| 2012/0098000 | A1* | 4/2012 | Tsang | H01L 33/508 257/98 |

(Continued)

*Primary Examiner* — Tracie Y Green
(74) *Attorney, Agent, or Firm* — Winston Hsu

(57) ABSTRACT

A light emitting diode package structure and a manufacturing method thereof and a display device are provided. The light emitting diode package structure includes a blue light emitting diode and a phosphor layer. The phosphor layer is disposed on the blue light emitting diode package structure, and the phosphor layer includes an encapsulation layer and a plurality of phosphor powders. The phosphor powders are disposed in the encapsulation layer and consist of green phosphor powders, red phosphor powders, and yellow phosphor powders, in which a weight percentage of the yellow phosphor powders ranges from 1% to 10%.

16 Claims, 8 Drawing Sheets

(56) References Cited

U.S. PATENT DOCUMENTS

| | | | |
|---|---|---|---|
| 2012/0306356 A1* | 12/2012 | Yoon | C09K 11/7734 |
| | | | 313/503 |
| 2014/0167600 A1* | 6/2014 | Todorov | C09K 11/7774 |
| | | | 313/503 |
| 2015/0194575 A1* | 7/2015 | Kang | H01L 33/502 |
| | | | 349/42 |
| 2017/0040262 A1* | 2/2017 | Lin | H01L 33/56 |
| 2021/0005818 A1* | 1/2021 | Kawahara | C08K 5/0041 |

* cited by examiner

LIGHT EMITTING DIODE PACKAGE STRUCTURE AND MANUFACTURING METHOD THEREOF AND DISPLAY DEVICE

CROSS REFERENCE TO RELATED APPLICATION

This application claims the benefit of Chinese Patent Application Serial No. 202010640296.9, filed Jul. 6, 2020, the entire content of which is incorporated herein by reference.

BACKGROUND OF THE INVENTION

1. Field of the Invention

The present invention relates to a light emitting diode package structure and manufacturing method thereof and display device, more particularly to a display device with wide color gamut and capable of reducing dangerous blue light and a light emitting diode package structure in the display device and a manufacturing method thereof.

2. Description of the Prior Art

With the increasing popularity of display devices, the performance of the display devices becomes more and more important. For example, consumers are paying more and more attention to the requirements of energy saving, eye protection, and wide color gamut. Currently, the eye protection function in mainstream display devices is not achieved through its own hardware design, but only through software algorithms to reduce the proportion of dangerous blue light. However, users will still be harmed by the blue light with low wavelength and high energy. Although some display devices can reduce the dangerous blue light by hardware design, they cannot meet the specifications of wide color gamut, energy conservation and environmental protection (for example, ENERGY STAR®).

SUMMARY OF THE INVENTION

According to an embodiment of the present invention (disclosure), a light emitting diode package structure is provided. The light emitting diode package structure includes a blue light emitting diode and a phosphor layer. The blue light emitting diode is used to generate a first light, and the phosphor layer is disposed on the blue light emitting diode. The phosphor layer includes an encapsulation layer and a plurality of phosphor powders, in which the phosphor powders are disposed in the encapsulation layer and consist of green phosphor powders, red phosphor powders and yellow phosphor powders, and a weight percentage of the yellow phosphor powders ranges from 1% to 10%.

According to another embodiment of the present invention (disclosure), a display device is provided. The display device includes a display panel and a back light module. The back light module is disposed on a rear surface of the display panel, and the back light module includes at least one light emitting diode package structure. The light emitting diode package structure includes a blue light emitting diode and a phosphor layer. The blue light emitting diode is used to generate a first light, and the phosphor layer is disposed on the blue light emitting diode. The phosphor layer includes an encapsulation layer and a plurality of phosphor powders, in which the phosphor powders are disposed in the encapsulation layer and consist of green phosphor powders, red phosphor powders and yellow phosphor powders, and a weight percentage of the yellow phosphor powders ranges from 1% to 10%.

According to yet another embodiment of the present invention (disclosure), a manufacturing method of the light emitting diode package structure is provided. First, a blue light emitting diode is disposed on a carrier, and then, a plurality of phosphor powders are mixed proportionally in a glue to form a phosphor solution, wherein the phosphor powders consist of green phosphor powders, red phosphor powders and yellow phosphor powders, and a weight percentage of the yellow phosphor powders ranges from 1% to 10%. After that, at least a portion of the phosphor solution is disposed on the blue light emitting diode, and the portion of the phosphor solution is cured to form a phosphor layer on the blue light emitting diode.

These and other objectives of the present invention will no doubt become obvious to those of ordinary skill in the art after reading the following detailed description of the preferred embodiment that is illustrated in the various figures and drawings.

DETAILED DESCRIPTION

The present invention (disclosure) may be detailed by reference to the following embodiments, taken in conjunction with the drawings as described below, and for purposes of illustrative clarity and being easily understood by the readers, various drawings of this disclosure may be simplified, and the elements in various drawings may not be drawn to scale. In addition, the number and dimension of each element shown in drawings are only illustrative and are not intended to limit the scope of the present disclosure.

Figure 1:
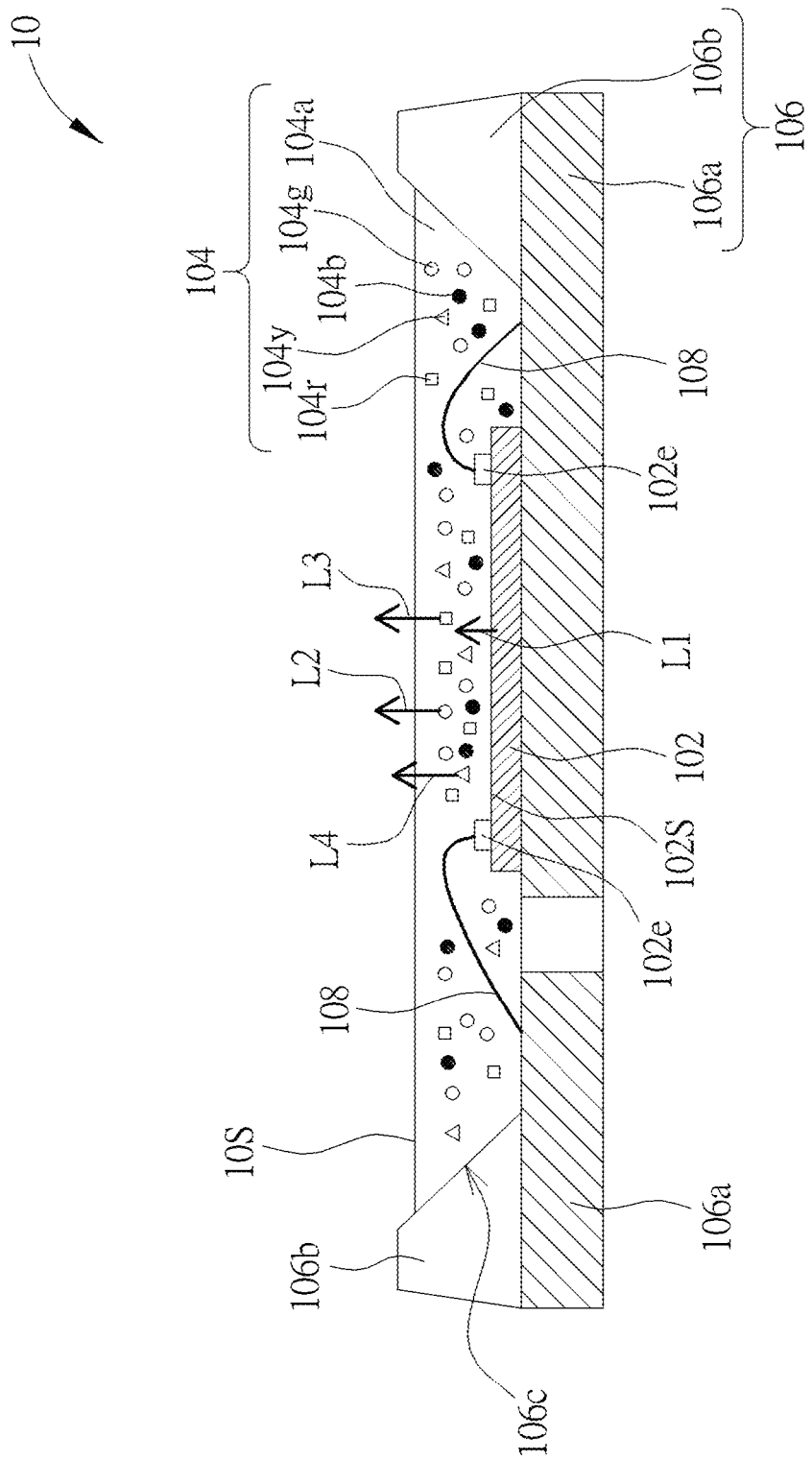
FIG. 1 schematically illustrates a cross-sectional view of a light emitting diode package structure according to an embodiment of the present invention (disclosure).

Referring to FIG. 1, FIG. 1 schematically illustrates a cross-sectional view of a light emitting diode package structure according to an embodiment of the present invention (disclosure). The light emitting diode package structure 10 provided by the present embodiment may include a blue light emitting diode 102 and a phosphor layer 104. The blue light emitting diode 102 includes a light output surface 102S for generating a first light L1, and the phosphor layer 104 may be disposed on the light output surface 102S of the blue light emitting diode 102. The phosphor layer 104 is used to absorb a portion of the first light L1 and convert the first light L1 into a second light L2, a third light L3 and a fourth light L4. The first light L1, the second light L2, the third light L3 and the fourth light L4 may include different colors, such that the first light L1, the second light L2, the third light L3 and the fourth light L4 may be mixed with each other to form a white light emitted from the light output surface 10S of the light emitting diode package structure 10. In some embodiments, the light output surface 102S of the blue light emitting diode 102 may be its upper surface and/or side surface. The blue light emitting diode 102 may for example be an inorganic semiconductor light emitting diode chip or an organic light emitting diode, but not limited thereto. Although only one blue light emitting diode 102 is shown in FIG. 1, the number of the blue light emitting diode 102 in the light emitting diode package structure 10 may be more than one, which is not limited to what is shown in FIG. 1. The first light L1 may be a blue light, for example, the wavelength of the peak of the first light L1 may range from 450 nanometers (nm) to 460 nm, such as 455 nm to 457.5 nm or 457.5 nm to 460 nm, but not limited thereto. In order to make the phosphor layer 104 being excited by the first light L1 and generating the second light L2, the third light L3 and the fourth light L4, the wavelength of the first light L1 may be lower than the wavelengths of the second light L2, the third light L3 and the fourth light L4. For example, the second light L2 may be a green light, the third light L3 may be a red light, and the fourth light L4 may be a yellow light.

The phosphor layer 104 may include a plurality of phosphor powders, and the phosphor powders consist of green phosphor powders 104g, red phosphor powders 104r and yellow phosphor powders 104y, wherein the green phosphor powders 104g may convert the first light L1 into the second light L2, the red phosphor powders 104r may convert the first light L1 into the third light L3, and the yellow phosphor powders 104y may convert the first light L1 into the fourth light L4. For example, the wavelength of the peak of the second light L2 may range from 530 nm to 540 nm, the wavelength of the peak of the third light L3 may range from 630 nm to 650 nm, and the wavelength of the peak of the fourth light L4 may range from 550 nm to 570 nm. In such condition, the material of the green phosphor powder 104g may for example include $(Ca, Eu)_{m/2}Si_{12-(m+n)}Al_{m+n}O_nN_{16-n}$ or other suitable materials, the material of the red phosphor powder 104r may for example include $CaAlSiN_3$: $Eu^{2+}$, $A_xMF_y:Mn^{4+}$ (where A may be lithium, sodium, potassium, calcium, strontium, barium, and M may be silicon, aluminum, yttrium, scandium) or other suitable materials, and the material of the yellow phosphor powder 104y may for example include $YAG(Y_3Al_5O_{12}:Ce^{3+})$ or other suitable materials, but not limited thereto. The phosphor layer 104 may further include an encapsulation layer 104a for protecting the blue light emitting diode 102. The phosphor powders consisting of the green phosphor powders 104g, the red phosphor powders 104r and the yellow phosphor powders 104y are dispersedly disposed in the encapsulation layer 104a. The encapsulation layer 104a may for example include liquid insulating packaging material such as epoxy resin, but not limited thereto. In some embodiments, the phosphor layer 104 may further include a plurality of dispersing particles 104b for uniformly dispersing the green phosphor powders 104g, the red phosphor powders 104r and the yellow phosphor powders 104y in the encapsulation layer 104a. The dispersing particles 104b may for example include spherical silicone resin micro-powder or other suitable materials. In some embodiments, the dispersing particles 104b may include the function of scattering the light, thereby improving the mixing of the first light L1, the second light L2, the third light L3 and the fourth light L4.

In the phosphor layer 104, when the total weight percentage of the green phosphor powders 104g, the red phosphor powders 104r and the yellow phosphor powders 104y is 100%, the weight percentage of the green phosphor powders 104g may range from 35% to 80%, the weight percentage of the red phosphor powders 104r may range from 15% to 55%, and the weight percentage of the yellow phosphor powders 104y may range from 1% to 10%. According to different materials of the green phosphor powders 104g and/or different materials of the red phosphor powders 104r, the weight percentages of the green phosphor powders 104g and the red phosphor powders 104r may be in different ranges. For example, when the weight percentage of the green phosphor powders 104g may range from 35% to 45%, the weight percentage of the red phosphor powders 104r may range from 50% to 55%. Alternatively, when the weight percentage of the green phosphor powders 104g may range from 70% to 80%, the weight percentage of the red phosphor powders 104r may range from and 15% to 20%. The weight percentages mentioned above are defined based on the total weight of the green phosphor powders 104g, the red phosphor powders 104r and the yellow phosphor powders 104y. It should be noted that by adjusting the proportion of the green phosphor powders 104g, the red phosphor powders 104r and the yellow phosphor powders 104y within the above-mentioned ranges, the light emitting diode package structure 10 may provide white light with wide color gamut and low blue light hazard, and it also meets the energy-saving requirement of ENERGY STAR® version 8.0 set by the U.S. Environmental Protection Agency (EPA), which is described in the content with reference to FIG. 5 to FIG. 8 in detail below.

The light emitting diode package structure 10 may further include a carrier 106 for holding the blue light emitting diode 102 and the phosphor layer 104. In the present embodiment, the carrier 106 may be a lead frame, and may include at least two conductive pads 106a and a package body 106b. The conductive pads 106a may be fixed on the package body 106b and electrically insulated from each other through the package body 106b. For example, before the blue light emitting diode 102 is disposed on the conductive pads 106a, the package body 106b may be formed on a portion of the conductive pads 106a and between the conductive pads 106a through a molding process. The conductive pads 106a may be fixed on the package body 106b to be served as pins of the light emitting diode package structure 10, which electrically connect the light emitting diode package structure 10 to other circuit boards or elements. In the embodiment shown in FIG. 1, the conductive pads 106a and the package body 106b may form a recess 106c, and the conductive pads 106a are located at the bottom of the recess 106c. Therefore, the first light L1 generated by the blue light emitting diode 102 disposed on one of the conductive pads 106a may be gathered through the recess 106c and emitted to the light output surface 10S, thereby improving the light utilization efficiency of the blue light emitting diode 102. The phosphor layer 104 may be disposed in the recess 106c to cover the blue light emitting diode 102, such that the green phosphor powders 104g, the red phosphor powders 104r and the yellow phosphor powders 104y in the phosphor layer 104 may fully absorb the first light L1 of the blue light emitting diode 102. The conductive pads 106a may for example include copper, silver or other suitable materials, but not limited thereto. The package body 106b may for example include epoxy molding compound (EMC) or other suitable materials. The packaging method of the light emitting diode package structure 10 of the present invention is not limited to the above-mentioned method. In some embodiments, the carrier 106 may for example be a circuit board or other types of carrier, but not limited thereto.

In the embodiment shown in FIG. 1, the light emitting diode package structure 10 may further include at least two wires 108 for respectively electrically connecting the two electrodes 102e (such as the anode and the cathode) of the blue light emitting diode 102 to corresponding conducive pads 106a. The number of the wires 108 is not limited to what is shown in FIG. 1. In some embodiments, the number of the wire 108 for connecting one of the electrodes 102e of the blue light emitting diode 102 to its corresponding conductive pad 106a may be greater than or equal to two. Alternatively, the number of the wire 108 for connecting another one of the electrodes 102e of the blue light emitting diode 102 to its corresponding conductive pad 106a may be greater than or equal to two. Thus, the current provided to the blue light emitting diode 102 may be increased. The wires 108 may for example include gold wires or other suitable materials. In the present embodiment, the phosphor layer 104 may cover the wires 108 to protect the wires 108. In some embodiments, the blue light emitting diode 102 may be disposed on the carrier 106 and be electrically connected to the carrier 106 through a flip-chip method.

Figure 2:
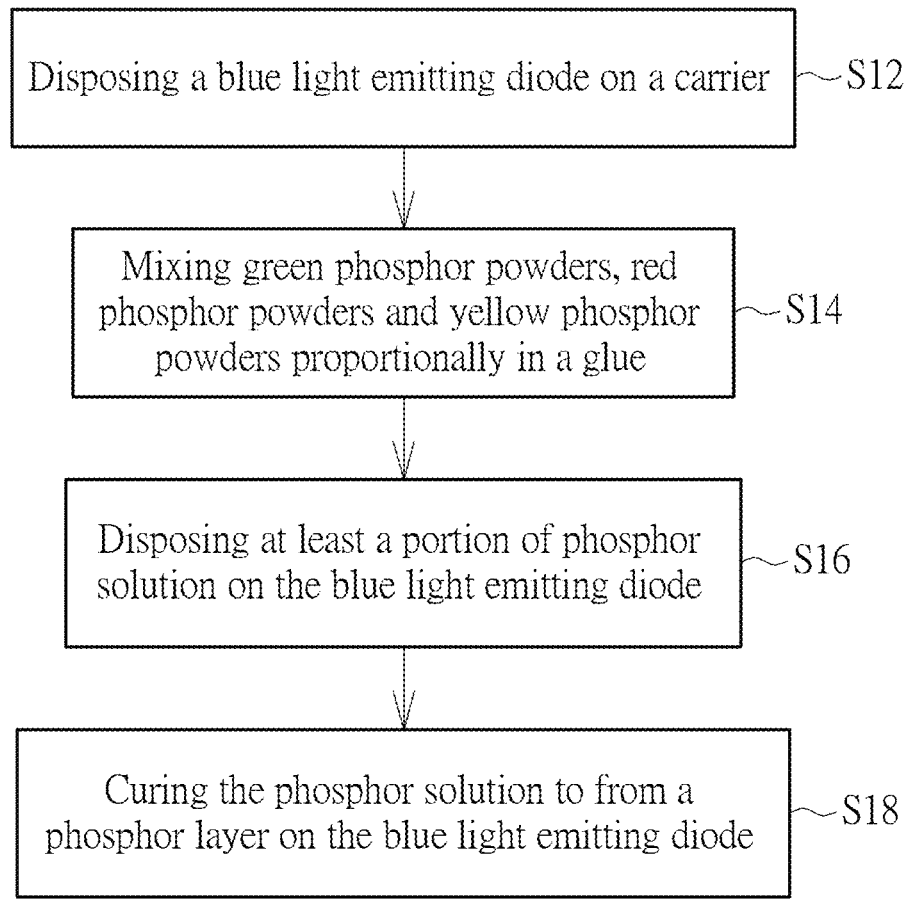
FIG. 2 schematically illustrates a flow chart of a manufacturing method of a light emitting diode package structure according to an embodiment of the present invention (disclosure).
Figure 3:
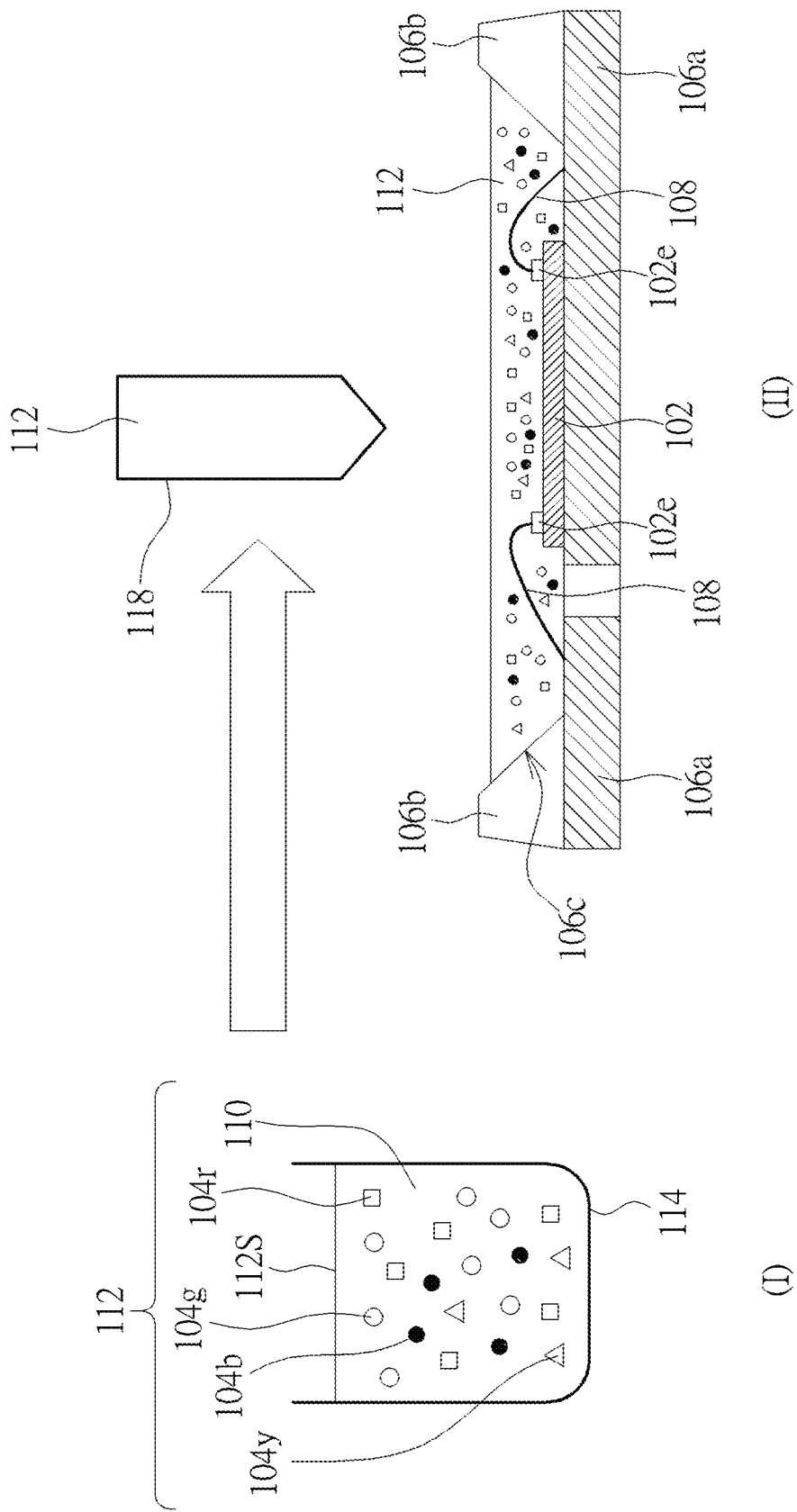
FIG. 3 schematically illustrates a method of forming a phosphor layer according to an embodiment of the present invention (disclosure).

Referring to FIG. 2 and FIG. 3, FIG. 2 schematically illustrates a flow chart of a manufacturing method of a light emitting diode package structure according to an embodiment of the present invention (disclosure), and FIG. 3 schematically illustrates a method of forming a phosphor layer according to an embodiment of the present invention (disclosure). As shown in FIG. 2, a manufacturing method of the light emitting diode package structure 10 provided by the present embodiment may include step S12 to step S18, which will be further described in conjunction with FIG. 3 and taking the light emitting diode package structure 10 shown in FIG. 1 as an example, but not limited thereto. The manufacturing method of the present embodiment may also be applied to other light emitting diode package structures in other embodiments. First, starting from the step S12, the blue light emitting diode 102 is disposed on the carrier 106. For example, the blue light emitting diode 102 may be adhered to the carrier 106 through a die bonding adhesive (not shown in FIG. 3) by a die bonding process, but not limited thereto. In the present embodiment, after the blue light emitting diode 102 is disposed on the carrier 106, the wires 108 may be formed and used to connect the electrodes 102e of the blue light emitting diode 102 with the corresponding conductive pads 106a through a wire bonding process.

Then, the step S14, the step S16 and the step S18 are performed to form the phosphor layer 104 on the blue light emitting diode 102. Specifically, as shown in FIG. 2 and part (I) of FIG. 3, in the step S14, the phosphor powders consisting of the green phosphor powders 104g, the red phosphor powders 104r and the yellow phosphor powders 104y may be mixed proportionally in a glue 110 to form a phosphor solution 112, wherein the proportion of the green phosphor powders 104g, the red phosphor powders 104r and the yellow phosphor powders 104y may refer to the weight percentages mentioned above. After that, a stirring process and a vacuum degassing process may be performed on the glue 110 mixed with the green phosphor powders 104g, the red phosphor powders 104r and the yellow phosphor powders 104y to remove the gas in the glue 110 and uniformly disperse the green phosphor powders 104g, the red phosphor powders 104r and the yellow phosphor powders 104y in the glue 110. For example, the glue 110 mixed with the green phosphor powders 104g, the red phosphor powders 104r and the yellow phosphor powders 104y may be disposed in a mixing container 114, and may for example be stirred manually or by a homogenizer, and then, the vacuum degassing process may be performed by a vacuum degassing device, but not limited thereto. In the present embodiment, the stirring process may further include adding the dispersing particles 104b into the glue 110 to uniformly disperse the green phosphor powders 104g, the red phosphor powders 104r and the yellow phosphor powders 104y in the glue 110.

Then, as shown in FIG. 2, in the step S16, at least a portion of the phosphor solution 112 is disposed on the blue light emitting diode 102. In the present embodiment, as shown in part (II) of FIG. 3, at least a half of the phosphor solution 112 in the mixing container 114 (for example, at least a half of the phosphor solution 112 close to the upper surface 112S shown in part (I) of FIG. 3) may be putted or poured into a dispensing container 118 after the stirring process and the vacuum degassing process, and then, the phosphor solution 112 from the dispensing container 118 is disposed in the recess 106c through a dispenser, thereby being disposed on the blue light emitting diode 102. The portion of the phosphor powders close to the upper surface 112S of the phosphor solution 112 may be more uniformly mixed, but the phosphor powders close to the bottom of the phosphor solution 112 is prone to be precipitated, so the possibility that the portion of the phosphor solution 112 which is not uniformly mixed (for example, at least one third of the phosphor solution 112 which is close to the bottom of the phosphor solution 112) is used for manufacturing the light emitting diode package structure 10 may be reduced by using at least a half of the phosphor solution 112 close to the upper surface 112S (for example, the portion of the phosphor solution 112 from the upper surface 112S to the part whose depth is at least a half of the height of the phosphor solution 112) of the phosphor solution 112, thereby reducing color point deviation between different light emitting diode package structures 10. For example, the deviation between the color points corresponding to the same color on the chromaticity diagram may be reduced to be less than or equal to 0.009, thereby improving the uniformity of different manufactured light emitting diode package structures 10. It should be noted that the remaining half or less of the phosphor solution 112 in the mixing container 114 may be used to prepare another phosphor solution in the mixing container 114.

Then, as shown in FIG. 1 and FIG. 2, in the step S18, the phosphor solution 112 is cured to form the phosphor layer 104 on the blue light emitting diode 102. The method of curing the phosphor solution 112 may for example include a drying process or an ultraviolet light curing process, but not limited thereto.

Figure 4:
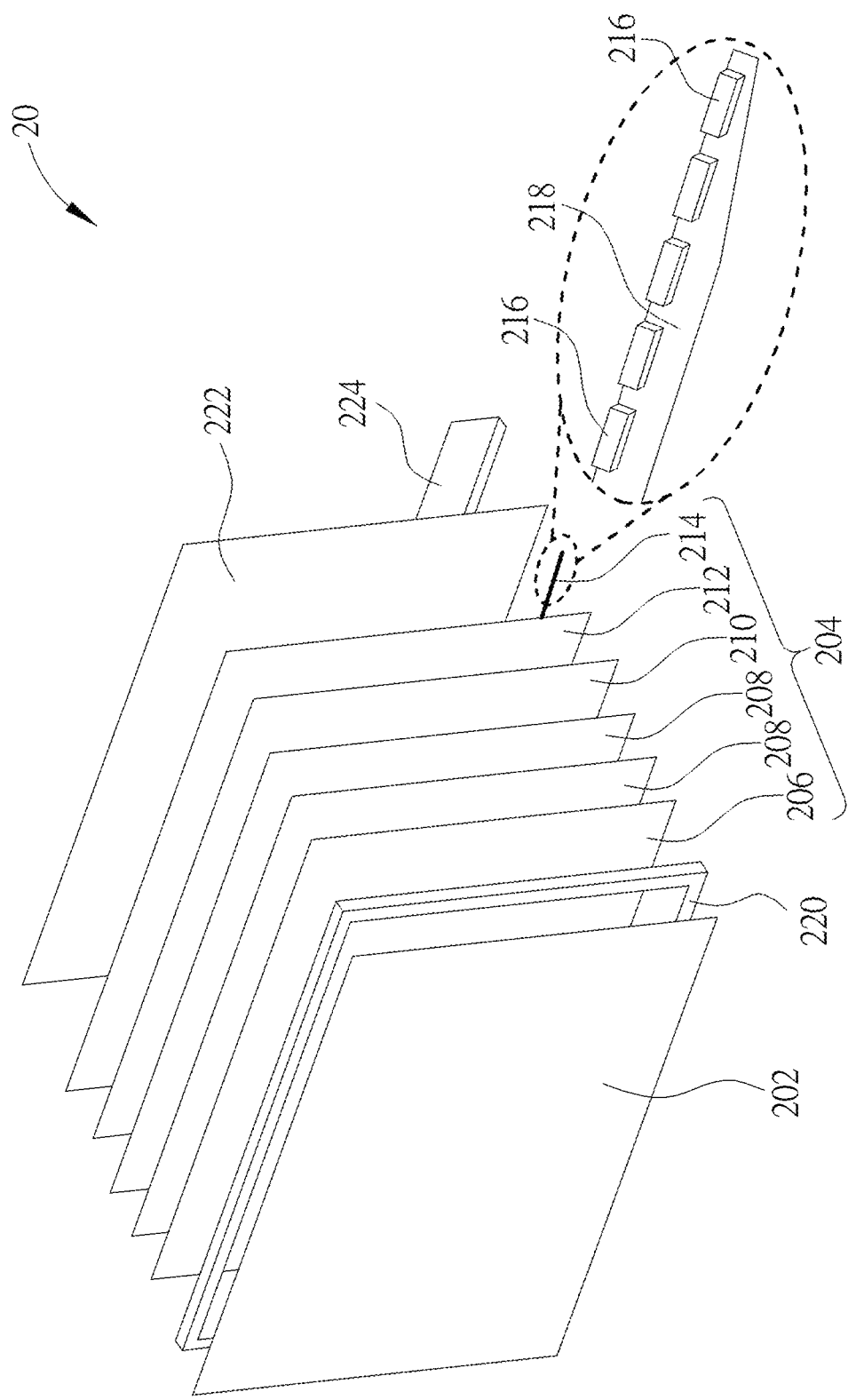
FIG. 4 schematically illustrates an exploded view of a display device according to an embodiment of the present invention (disclosure).

The light emitting diode package structure 10 of the present invention may further be applied to a display device 20. The display device 20 may take a liquid crystal display device for an example, and the light emitting diode package structure 10 shown in FIG. 1 is also taken as an example for description in the following, but not limited thereto. Referring to FIG. 4, FIG. 4 schematically illustrates an exploded view of a display device according to an embodiment of the present invention (disclosure). As shown in FIG. 4, the display device 20 provided by the present embodiment may include a display panel 202 and a back light module 204, and the back light module 204 is disposed on the rear surface of the display panel 202. The display panel 202 may be any non-self-luminous display panel that requires a backlight source, such as a liquid crystal display panel. The backlight module 204 of the present embodiment may for example be an edge-type backlight module, and may include a plurality of optical films, a light guide plate 210, a reflector 212 and a light source module 214, wherein the optical films may for example include a brightness enhancement film 206 and a diffuser 208, and the light guide plate 210, the diffuser 208 and the brightness enhancement film 206 may be disposed on the reflector 212 in sequence. The light source module 214 may be disposed at a side of the light guide plate 210, such that the light generated by the light source module 214 may enter from the side surface of the light guide plate 210. The light may be emitted from the surface of the light guide plate 210 to face the diffuser 208 through the light guide plate 210 and the reflector 212. Besides, the brightness of the light may become uniform, and the brightness of the light toward the display panel 202 may be improved through the diffuser 208 and the brightness enhancement film 206, The light source module 214 may include a plurality of light emitting diode package structures 216 and a circuit board 218. The light emitting diode package structures 216 may be arranged along the extending direction of the circuit board 218, such that the light source module 214 may be string-shaped, and the present invention is not limited thereto. In some embodiments, the number of the light emitting diode package structures 216 is not limited to what is shown in FIG. 4. For example, the light source module 214 may include one light emitting diode package structure 216. In some embodiments, the backlight module 204 may include a plurality of light source modules 214 disposed on different side surfaces of the light guide plate 210 to improve the brightness of the backlight. The light emitting diode package structure 216 may adopt the light emitting diode package structure 10 mentioned above, and will not be redundantly described here. In some embodiments, the backlight module 204 may be a direct-type backlight module, and in such situation, the light emitting diode package structures 216 may be uniformly distributed between the light guide plate 210 and the reflector 212, or when the backlight module 204 does not include the light guide plate 210, the light emitting diode package structures 216 may be disposed between the diffuser 208 and the reflector 212. In some embodiments, the backlight module 204 may include a plurality of diffusers 208 disposed between the brightness enhancement film 206 and the light guide plate 210. In some embodiments, the structure of the backlight module 204 is not limited to the above-mentioned structures. According to the requirements, the number, type, and relation between positions of the optical films in the backlight module 204 may be adjusted.

In some embodiments, the display device 20 may further include a middle frame 220, aback frame 222 and a cover plate 224 for supporting the display panel 202, the brightness enhancement film 206, the diffuser 208, the light guide plate 210, the reflector 212 and the light source module 214. The cover plate 224 may further be used to reduce light leakage from sides of the display device 20. The supporting structure of the present invention is not limited to the above-mentioned structure, and other suitable designs may also be adopted.

Figure 5:
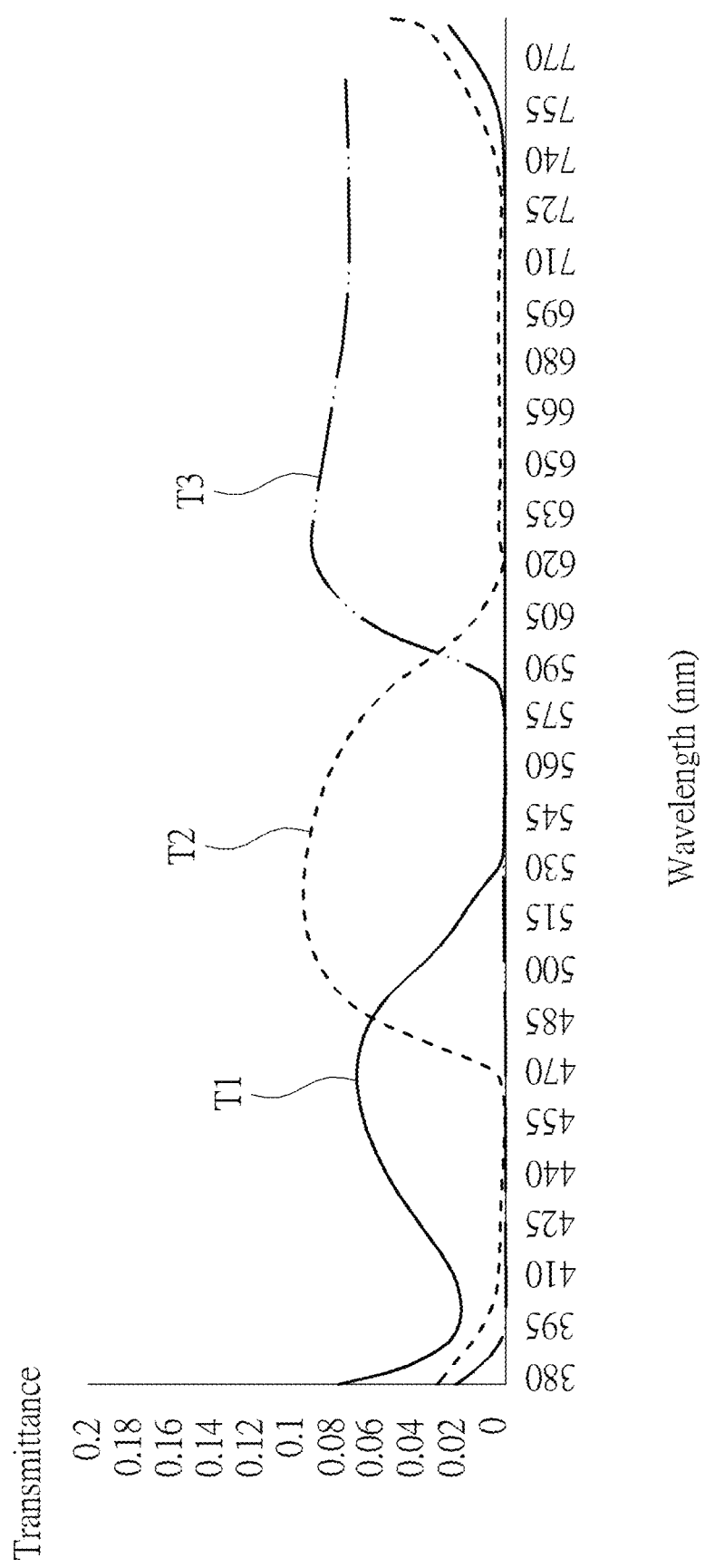
FIG. 5 schematically illustrates a transmission spectrum of a color filter according to an embodiment of the present invention (disclosure).
Figure 6:
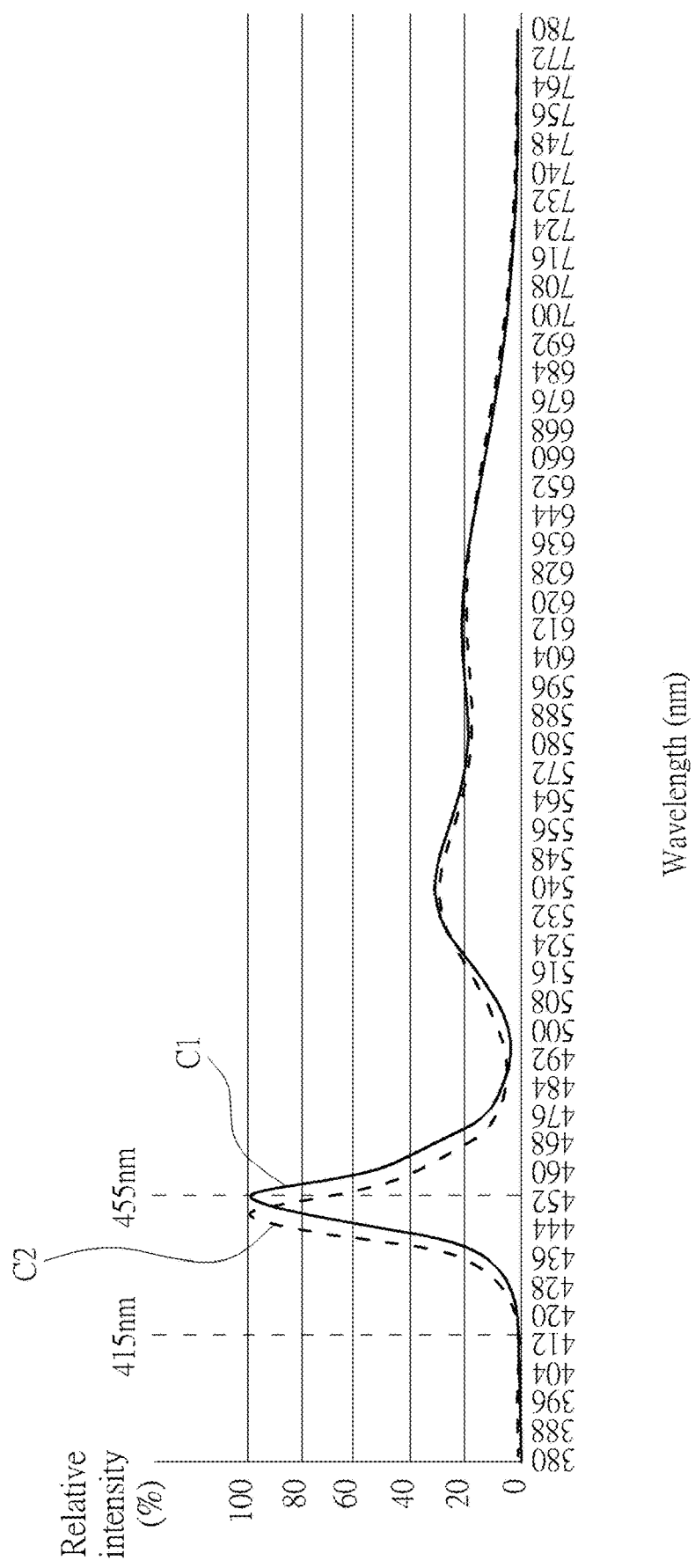
FIG. 6 schematically illustrates spectrums of white light generated by a display device of an embodiment and white light generated by a display device of a comparative embodiment when operating at the highest gray level.

The display panel 202 may include a plurality of pixels or sub pixels (not shown) for adjusting the gray levels of the light passing through the display panel 202, such that the display device 20 may display images. For example, each of the pixels may include a red sub pixel, a green sub pixel and a blue sub pixel to allow corresponding portions of the white light generated by the light emitting diode package structures 216 to penetrate through the display panel 202, thereby generating the red light, the green light and the blue light respectively, but not limited thereto. The following content will further explain that the white light with a wide color gamut and low blue light may be formed by mixing the red light, the green light and the blue light generated by the display device 20. Referring to FIG. 5 and FIG. 6, FIG. 5 schematically illustrates a transmission spectrum of a color filter according to an embodiment of the present invention (disclosure), and FIG. 6 schematically illustrates spectrums of white light generated by a display device of an embodiment and white light generated by a display device of a comparative embodiment when operating at the highest gray level (for example, in the case of 8-bit color, when the gray levels of the red sub-pixel, green sub-pixel and blue sub-pixel are 255). In an embodiment, the transmission spectrum of the color filters of the red sub pixel, the green sub pixel and the blue sub pixel in the display panel 202 shown in FIG. 4 may for example be shown in FIG. 5, but not limited thereto. As shown in FIG. 5, the transmission spectrum T1 may represent the transmission spectrum of the blue color filter of the blue sub pixel, the transmission spectrum T2 may represent the transmission spectrum of the green color filter of the green sub pixel, and the transmission spectrum T3 may represent the transmission spectrum of the red color filter of the red sub pixel. When the display device takes the transmission spectrum T1, the transmission spectrum T2, and the transmission spectrum T3 shown in FIG. 5 for an example, the spectrum of the white light generated when the display device is operating at the highest gray level may be as shown in FIG. 6, wherein a curve C1 may represent the spectrum of the white light generated when the display device 20 of the above-mentioned embodiment is operating at the highest gray level, and a curve C2 may represent the spectrum of the white light generated when the display device of the comparative embodiment is operating at the highest gray level. Compared with the above-mentioned embodiment, the display device of the comparative embodiment uses a light emitting diode package structure that only has the green phosphor powders and the red phosphor powders added into the phosphor layer. As shown in FIG. 6, an integral value of the curve C1 from 415 nm to 455 nm may be less than an integral value of the curve C2 from 415 nm to 455 nm. Therefore, a ratio (first ratio) of the integral value of the curve C1 (from 415 nm to 455 nm) to the integral value of the curve C1 (from 400 nm to 500 nm) may be less than a ratio (second ratio) of the integral value of the curve C2 (from 415 nm to 455 nm) to the integral value of the curve C2 (from 400 nm to 500 nm). It can be seen that as compared with the light emitting diode package structures that only has the green phosphor powders and the red phosphor powders added into the phosphor layer as the display device of the light source, the integral value from 415 nm to 455 nm can be reduced in the display device 20 of the above-mentioned embodiment. Because the green phosphor powders, the red phosphor powders and the yellow phosphor powders are added according to a certain proportion (such as the range of the proportion mentioned above) into the phosphor layer of the display device 20 of the above-mentioned embodiment, the integral value from 415 nm to 455 nm can be reduced, thereby reducing the blue light hazard of the white light to users generated by the display device 20. For example, the first ratio of the curve C1 may be less than or equal to 50%, the first ratio may for example be 45.84%, 44.9%, 40.1%, 35.67% or 33.74% according to different display panels 202, and the color temperature of white light may for example be 6650K, 6861K, 6485K or 6335K, but the present invention is not limited thereto. The second ratio of the curve C2 may be 53.45% or 55.38%. Because the first ratio of the curve C1 may be less than or equal to 50%, the color temperature of white light corresponding to the curve C1 may range from 5500K to 7000K, and the display device 20 of the above-mentioned embodiment may reduce the blue light hazard and comply with the low blue light test standard of TÜV Rheinland®. In some embodiments, when the display device 20 of the above-mentioned embodiment is applied to computer screens, the x-coordinate value of the white light generated by the display device 20 on a CIE 1931 chromaticity diagram may range from 0.283 to 0.343, and the y-coordinate value of the white light on the CIE 1931 chromaticity diagram may range from 0.299 to 0.359. Besides, when the display device 20 of the above-mentioned embodiment is applied to televisions, the x-coordinate value of the white light generated by the display device 20 on the CIE 1931 chromaticity diagram may range from 0.25 to 0.31, and the y-coordinate value of the white light on the CIE 1931 chromaticity diagram may range from 0.26 to 0.32.

Figure 7:
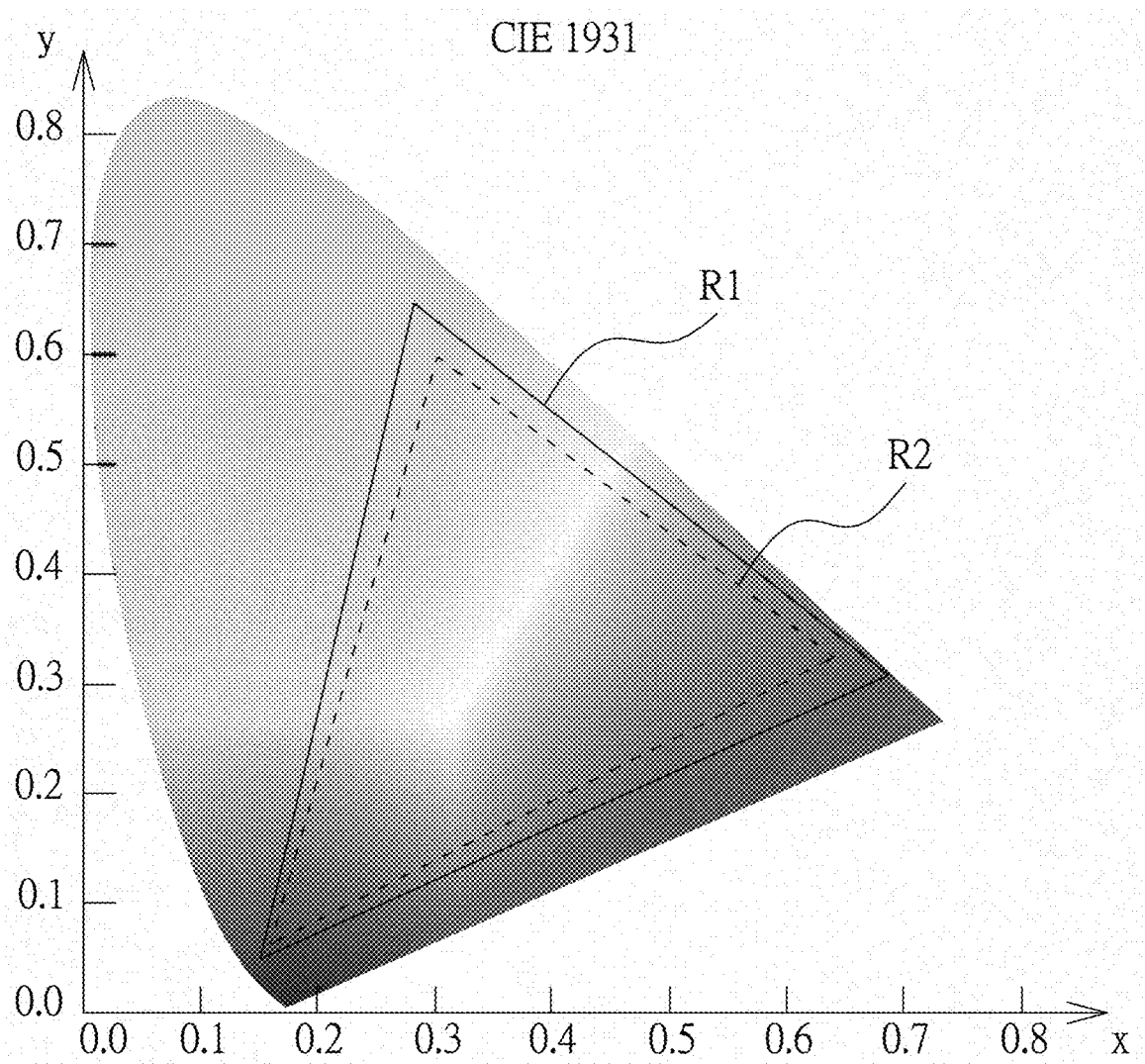
FIG. 7 schematically illustrates a region of a color gamut generated by a display device of an embodiment and a region of standard RGB color gamut in CIE 1931 chromaticity diagram.
Figure 8:
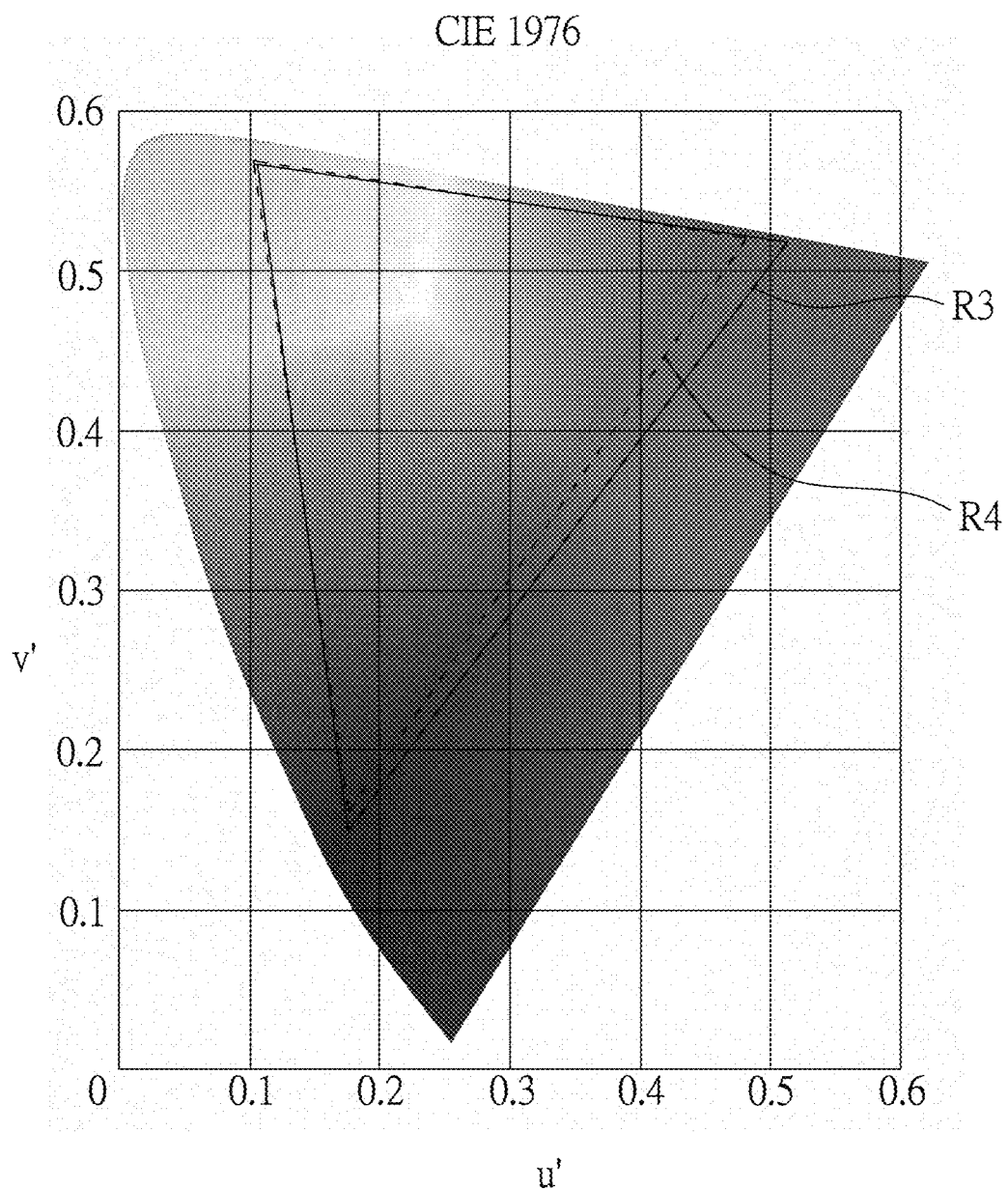
FIG. 8 schematically illustrates a region of a color gamut generated by a display device of an embodiment and a region of DCI-P3 color gamut in CIE 1976 chromaticity diagram.

Referring to FIG. 7 and FIG. 8, FIG. 7 schematically illustrates a region of a color gamut generated by a display device of an embodiment and a region of standard RGB (sRGB) color gamut on CIE 1931 chromaticity diagram, FIG. 8 schematically illustrates a region of a color gamut generated by a display device of an embodiment and a region of DCI-P3 color gamut on CIE 1976 chromaticity diagram. As shown in FIG. 7, a coverage of a region R1 of a color gamut generated by the display device 20 of the above-mentioned embodiment on the CIE 1931 chromaticity diagram to a region R2 of the standard RGB color gamut on the CIE 1931 chromaticity diagram may be 100%, which is superior to the coverage of the region of the color gamut (not shown) generated by the display device of the comparative embodiment to the region of the standard RGB color gamut that is only 96.15%. Therefore, through the phosphor layer made according to the weight percentages of the green phosphor powders, the red phosphor powders and the yellow phosphor powders mentioned above, the range of the color gamut of the display device 20 of the above-mentioned embodiment may be significantly improved. For example, when the gray level of the red sub pixel of the display device 20 is 255, and the gray level of the green sub pixel and the gray level of the blue sub pixel of the display device 20 are 0, the x-coordinate value of the color displayed by the display device 20 on the CIE 1931 chromaticity diagram may range from 0.6467 to 0.7067, and the y-coordinate value of the color displayed by the display device 20 on the CIE 1931 chromaticity diagram may range from 0.2836 to 0.3436; when the gray level of the green sub pixel of the display device 20 is 255, and the gray level of the red sub pixel and the gray level of the blue sub pixel of the display device 20 are 0, the x-coordinate value of the color displayed by the display device 20 on the CIE 1931 chromaticity diagram may range from 0.2411 to 0.3011, and the y-coordinate value of the color displayed by the display device 20 on the CIE 1931 chromaticity diagram may range from 0.6467 to 0.7067; and when the gray level of the blue sub pixel of the display device 20 is 255, and the gray level of the red sub pixel and the gray level of the green sub pixel of the display device 20 are 0, the x-coordinate value of the color displayed by the display device 20 on the CIE 1931 chromaticity diagram may range from 0.118 to 0.178, and the y-coordinate value of the color displayed by the display device 20 on the CIE 1931 chromaticity diagram may range from 0.0167 to 0.0767, but not limited thereto. As shown in FIG. 8, when the gray levels of the red sub pixel, the green sub pixel and the blue sub pixel are 255, a coverage of a region R3 of a color gamut of the display device 20 on the CIE 1976 chromaticity diagram to a region R4 of the DCI-P3 color gamut on the CIE 1976 chromaticity diagram may be greater than 95% (such as 95.87%, 96.08% or 97.81%), but not limited thereto.

In addition, the display device 20 of the above-mentioned embodiment can still meet the standard after passing the test conditions of ENERGY STAR® 8.0 version. For example, when the standard of total energy consumption of ENERGY STAR® 8.0 version is 78.36 kilowatt-hour (kW h) per year, the total energy consumption of the display device 20 may be 73.32 kW h per year, 73.93 kW h per year or 72.4 kW h per year.

In summary, in the display device of the present invention, the low blue light hazard can the achieved by the hardware design, and the demand of high color gamut and regulations of the energy saving and environmental protection can be satisfied by selecting the blue light emitting diode with longer peak wavelength as well as the proportion of the green phosphor powders, the red phosphor powders and the yellow phosphor powders that is within a certain range.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light emitting diode package structure, comprising:
   a blue light emitting diode generating a first light, and
   a phosphor layer disposed on the blue light emitting diode, and the phosphor layer comprising an encapsulation layer and a plurality of phosphor powders, wherein the plurality of phosphor powders are disposed in the encapsulation layer and consist of green phosphor powders, red phosphor powders and yellow phosphor powders, a weight percentage of the yellow phosphor powders ranges from 1% to 10%, a weight percentage of the green phosphor powders ranges from 35% to 80%, and a weight percentage of the red phosphor powders ranges from 15% to 55%.

2. The light emitting diode package structure of claim 1, wherein the green phosphor powders convert the first light into a second light, a wavelength of a peak of the second light ranges from 530 nanometers to 540 nanometers, the red phosphor powders convert the first light into a third light, a wavelength of a peak of the third light ranges from 630 nanometers to 650 nanometers, the yellow phosphor powders convert the first light into a fourth light, and a wavelength of a peak of the fourth light ranges from 550 nanometers to 570 nanometers.

3. The light emitting diode package structure of claim 1, wherein a wavelength of a peak of the first light ranges from 450 nanometers to 460 nanometers.

4. A display device, comprising:
a display panel; and
a back light module disposed on a rear surface of the display panel, the back light module comprising at least one light emitting diode package structure, wherein the at least one light emitting diode package structure comprises:
a blue light emitting diode for generating a first light, and
a phosphor layer disposed on the blue light emitting diode, and the phosphor layer comprising an encapsulation layer and a plurality of phosphor powders, wherein the plurality of phosphor powders are disposed in the encapsulation layer and consist of green phosphor powders, red phosphor powders and yellow phosphor powders, a weight percentage of the yellow phosphor powders ranges from 1% to 10%, a weight percentage of the green phosphor powders ranges from 35% to 80%, and a weight percentage of the red phosphor powders ranges from 15% to 55%.

5. The display device of claim 4, wherein the green phosphor powders convert the first light into a second light, a wavelength of a peak of the second light ranges from 530 nanometers to 540 nanometers, the red phosphor powders convert the first light into a third light, a wavelength of a peak of the third light ranges from 630 nanometers into 650 nanometers, the yellow phosphor powders convert the first light into a fourth light, and a wavelength of a peak of the fourth light ranges from 550 nanometers to 570 nanometers.

6. The display device of claim 5, wherein a white light is formed by mixing the second light, the third light and the fourth light penetrating through the display panel, the white light has a spectrum, and a ratio of an integral value of the spectrum from 415 nanometers to 455 nanometers to an integral value of the spectrum from 400 nanometers to 500 nanometers is less than or equal to 50%.

7. The display device of claim 6, wherein a x-coordinate value of the white light on a CIE 1931 chromaticity diagram ranges from 0.283 to 0.343, and a y-coordinate value of the white light on the CIE 1931 chromaticity diagram ranges from 0.299 to 0.359.

8. The display device of claim 6, wherein a x-coordinate value of the white light on a CIE 1931 chromaticity diagram ranges from 0.25 to 0.31, and a y-coordinate value of the white light on the CIE 1931 chromaticity diagram ranges from 0.26 to 0.32.

9. The display device of claim 4, wherein a wavelength of a peak of the first light ranges from 450 nanometers to 460 nanometers.

10. The display device of claim 4, wherein a coverage of a region of a color gamut generated by the display device on a CIE 1931 chromaticity diagram to a region of a standard RGB color gamut on the CIE 1931 chromaticity diagram is 100%.

11. The display device of claim 4, wherein a coverage of a region of a color gamut generated by the display device on a CIE 1976 chromaticity diagram to a region of a DCI-P3 color gamut on the CIE 1976 chromaticity diagram is greater than 95%.

12. A manufacturing method of a light emitting diode package structure, comprising:
disposing a blue light emitting diode generating a first light on a carrier;
mixing a plurality of phosphor powders proportionally in a glue to form a phosphor solution, wherein the plurality of phosphor powders consist of green phosphor powders, red phosphor powders and yellow phosphor powders, a weight percentage of the yellow phosphor powders ranges from 1% to 10%, a weight percentage of the green phosphor powders ranges from 35% to 80%, and a weight percentage of the red phosphor powders ranges from 15% to 55%;
disposing at least a portion of the phosphor solution on the blue light emitting diode, and
curing the at least a portion of the phosphor solution to form a phosphor layer on the blue light emitting diode, wherein the phosphor layer is disposed on the blue light emitting diode, the phosphor layer comprises an encapsulation layer and the plurality of phosphor powders, and the plurality of phosphor powders are disposed in the encapsulation layer.

13. The manufacturing method of the light emitting diode package structure of claim 12, wherein the glue mixed with the green phosphor powders, the red phosphor powders and the yellow phosphor powders is disposed in a mixing container, and forming the phosphor solution further comprises performing a stirring process and a vacuum degassing process to the glue mixed with the green phosphor powders, the red phosphor powders and the yellow phosphor powders.

14. The manufacturing method of the light emitting diode package structure of claim 13, wherein the stirring process further comprises adding a plurality of dispersing particles into the glue.

15. The manufacturing method of the light emitting diode package structure of claim 13, further comprising putting at least a half of the phosphor solution in the mixing container into a dispensing container to dispose the at least a portion of the phosphor solution on the blue light emitting diode by the dispensing container after the stirring process and the vacuum degassing process.

16. The manufacturing method of the light emitting diode package structure of claim 12, wherein the green phosphor powders convert the first light generated by the blue light emitting diode into a second light, a wavelength of a peak of the second light ranges from 530 nanometers to 540 nanometers, the red phosphor powders convert the first light into a third light, a wavelength of a peak of the third light ranges from 630 nanometers to 650 nanometers, the yellow phosphor powders convert the first light into a fourth light, and a wavelength of a peak of the fourth light ranges from 550 nanometers to 570 nanometers.

* * * * *